United States Patent
Shimamoto et al.

(10) Patent No.: US 11,709,514 B2
(45) Date of Patent: Jul. 25, 2023

(54) VOLTAGE REGULATOR AND IN-VEHICLE BACKUP POWER SUPPLY

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventors: Kazushi Shimamoto, Yokkaichi (JP); Yuuki Sugisawa, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 93 days.

(21) Appl. No.: 17/610,969

(22) PCT Filed: Apr. 27, 2020

(86) PCT No.: PCT/JP2020/017929
§ 371 (c)(1),
(2) Date: Nov. 12, 2021

(87) PCT Pub. No.: WO2020/230604
PCT Pub. Date: Nov. 19, 2020

(65) Prior Publication Data
US 2022/0229454 A1      Jul. 21, 2022

(30) Foreign Application Priority Data
May 15, 2019   (JP) .............................. JP2019-091924

(51) Int. Cl.
*G05F 1/569*     (2006.01)
*H01L 29/866*    (2006.01)
*H02J 9/06*      (2006.01)

(52) U.S. Cl.
CPC ............ *G05F 1/569* (2013.01); *H01L 29/866* (2013.01); *H02J 9/061* (2013.01)

(58) Field of Classification Search
CPC .......... G05F 1/569; G05F 1/571; G05F 1/573; G05F 1/5735; G05F 1/575; G05F 1/59;
(Continued)

(56) References Cited

U.S. PATENT DOCUMENTS

| | | | | |
|---|---|---|---|---|
| 3,626,278 A | * | 12/1971 | Matsumura | ............... G05F 1/56 323/275 |
| 3,697,861 A | * | 10/1972 | Frazier | .................... G05F 1/573 323/901 |
| 5,773,965 A | * | 6/1998 | Hayashi | .............. H02M 3/1563 323/284 |

FOREIGN PATENT DOCUMENTS

| | | |
|---|---|---|
| JP | H11-305855 A | 11/1999 |
| JP | 2005-198439 A | 7/2005 |
| JP | 2010-055450 A | 3/2010 |

OTHER PUBLICATIONS

International Search Report, Application No. PCT/JP2020/017929, dated Jun. 30, 2020. ISA/Japan Patent Office.

* cited by examiner

*Primary Examiner* — Nguyen Tran
(74) *Attorney, Agent, or Firm* — Honigman LLP

(57) ABSTRACT

A voltage regulator is provided wherein electricity flows through a second transistor in an operating state in which a control unit) applies an operating voltage to a base of the second transistor. A Zener diode sets, in the operating state, a voltage of a second conductive path to a voltage corresponding to a voltage across the Zener diode. A current corresponding to an addition value obtained by adding a value of a current flowing through a second resistor portion in the operating state, a value of a current flowing through (Continued)

a third resistor portion in the operating state, and a value of a current flowing through the Zener diode in the operating state flows through a ground-side resistor portion. A control unit stops the output of the operating voltage when a voltage of the second conductive path is lower than or equal to a threshold value.

2 Claims, 3 Drawing Sheets

(58) Field of Classification Search
CPC .......... G05F 1/562; G05F 1/563; G05F 1/565; H01L 29/866; H02J 9/061
See application file for complete search history.

VOLTAGE REGULATOR AND IN-VEHICLE BACKUP POWER SUPPLY

CROSS-REFERENCE TO RELATED APPLICATIONS

This application is the U.S. national stage of PCT/JP2020/017929 filed on Apr. 27, 2020, which claims priority of Japanese Patent Application No. JP 2019-091924 filed on May 15, 2019, the contents of which are incorporated herein.

TECHNICAL FIELD

The present disclosure relates to a voltage regulator and an in-vehicle backup power supply.

BACKGROUND

In the protection system disclosed in JP 2005-198439A, a gate voltage of an external FET is controlled by an operational amplifier to which a reference voltage is input, and an output of the external FET is connected using resistance division. When the midpoint of the resistance division is input to the operational amplifier, feedback is added and a desired voltage is output.

A voltage regulator such as a linear regulator has a function of outputting a predetermined output voltage according to an input voltage. However, when an overcurrent occurs on the output side, it is desirable to interrupt such a function and forcibly stop the output. In this regard, in the technique disclosed in JP 2005-198439A, whether or not a short-circuit failure has occurred is determined using a comparator, and when the output of the LDO output voltage falls below a predetermined voltage, it is deemed that a short-circuit has occurred, and protection is performed by shutting down the LDO. However, in the technique that requires an operational amplifier and a comparator as in JP 2005-198439A, there is a concern that the circuit scale will become complex.

Therefore, an object of the present invention is to provide a configuration capable of realizing a voltage regulator or an in-vehicle backup power supply capable of forcibly stopping an output when an output current exceeds a reference, while keeping the circuit scale from being complex.

SUMMARY

A voltage regulator according to an embodiment of the present disclosure is a voltage regulator configured to receive an input voltage based on power supplied via a first conductive path, and output an output voltage to a second conductive path, the voltage regulator including: a switch including a control terminal, and provided between the first conductive path and the second conductive path; a first resistor portion having one end electrically connected to the first conductive path and another end electrically connected to the switch; a PNP-type first transistor having a base electrically connected to a conductive path between the first resistor portion and the switch directly or via a resistor; a second resistor portion having one end electrically connected to the first conductive path and another end electrically connected to an emitter of the first transistor; a third resistor portion having one end electrically connected to the conductive path between the first resistor portion and the switch, and another end electrically connected to a collector of the first transistor; an NPN-type second transistor; a ground-side resistor portion having one end electrically connected to an emitter of the second transistor and another end electrically connected to the ground; a Zener diode having an anode electrically connected to a conductive path between the emitter of the second transistor and the ground-side resistor portion, and a cathode electrically connected to the second conductive path; and a control unit configured to apply an operating voltage to a base of the second transistor, wherein the collector of the first transistor is electrically connected to a collector of the second transistor and the control terminal, electricity flows through the second transistor in the operating state in which the control unit applies the operating voltage to the base of the second transistor; the Zener diode sets, in the operating state, a voltage of the second conductive path to a voltage corresponding to a voltage across the Zener diode; a current corresponding to an addition value obtained by adding a value of a current flowing through the second resistor portion in the operating state, a value of a current flowing through the third resistor portion in the operating state, and a value of a current flowing through the Zener diode in the operating state flows through the ground-side resistor portion, and the control unit stops the output of the operating voltage when a voltage of the second conductive path is lower than or equal to a threshold value.

An in-vehicle backup power supply according to the present disclosure, including: a power storage unit electrically connected to the above first conductive path; and the above voltage regulator, wherein the control unit applies the operating voltage to the base of the second transistor in response to establishment of a backup condition.

Advantageous Effects of Invention

According to the present disclosure, it is possible to realize a voltage regulator or an in-vehicle backup power supply capable of forcibly stopping an output when an output current exceeds a reference, while keeping a circuit scale from being complex.

DETAILED DESCRIPTION OF PREFERRED EMBODIMENT

Figure 1:
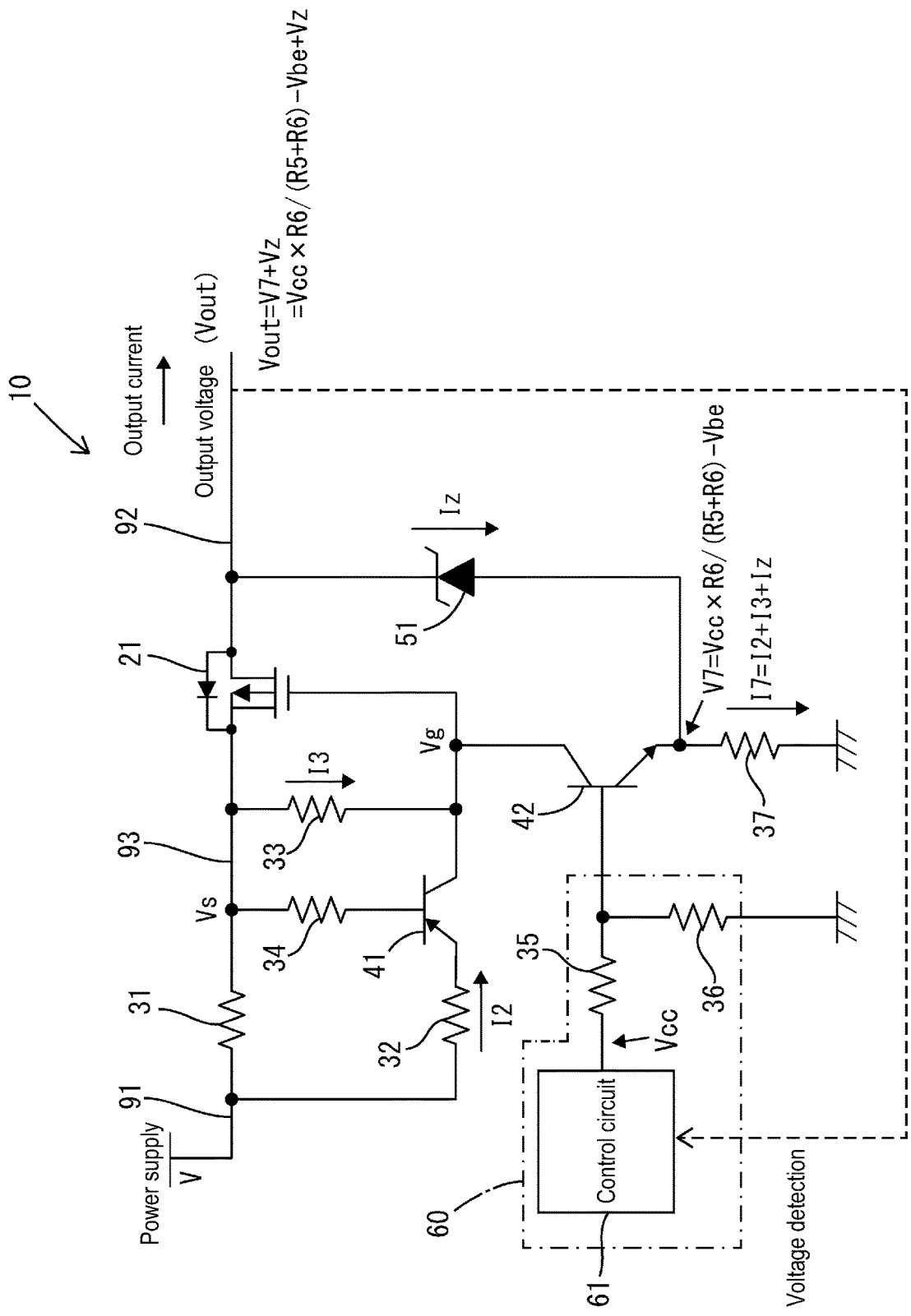
FIG. 1 is a circuit diagram illustrating a configuration of a voltage regulator according to an embodiment.

First, embodiments of the present disclosure will be listed and described.

In a voltage regulator according to an embodiment of the present disclosure, the collector of the first transistor is electrically connected to the collector of the second transistor and the control terminal. Electricity flows through the second transistor in the operating state in which the control unit applies an operating voltage to the base of the second transistor. The Zener diode sets the voltage of the second conductive path to a voltage corresponding to the voltage across the Zener diode in the above-described operating state. A current corresponding to an addition value obtained by adding a value of a current flowing through the second resistor portion in the operating state, a value of a current flowing through the third resistor portion in the operating state, and a value of a current flowing through the Zener diode in the operating state flows through the ground-side resistor portion. Then, the control unit stops the output of the operating voltage when the voltage of the second conductive path is lower than or equal to a threshold value.

The voltage regulator having the above-described configuration can achieve a configuration in which the output can be forcibly stopped when the output current flowing through the second conductive path exceeds a reference, while keeping a circuit scale from being complex. In particular, main elements other than the control unit can be mainly constituted by passive elements, which is highly advantageous in simplifying and miniaturizing a circuit.

An in-vehicle backup power supply according to an embodiment of the present disclosure is configured to include the voltage regulator described above, and thus can be a power supply having the same effects as those of the voltage regulator described above.

It is desirable that the above-described voltage regulator has the following actions and operations.

It is desirable that when the second transistor is in a non-electricity-flowing state, no current flows through the third resistor portion, and when the second transistor is in an electricity-flowing state, a third current corresponding to a potential difference between one end of the switch on the first resistor portion side and the control terminal flows through the third resistor portion. It is desirable that the switch is turned on when the third current flows. It is desirable that the voltage at the other end of the first resistor portion is set to a value corresponding to the current flowing through the switch by interposing the first resistor portion between the first conductive path and the switch. It is desirable that the emitter of the first transistor is connected to the first conductive path via the second resistor portion, and the base of the first transistor is electrically connected to the conductive path between the first resistor portion and the switch directly or via another member, so that a current flows through the first transistor when the first current flowing through the first resistor portion exceeds a predetermined value, and the second current flows through the second resistor portion. It is desirable that when the first current flowing through the first resistor portion is lower than or equal to the predetermined value, no current flows through the first transistor, and the second current does not flow through the second resistor portion. It is desirable that when the second transistor is in the electricity-flowing state, the emitter voltage of the second transistor is a fixed value that is based on the base voltage and the base-emitter voltage of the second transistor. It is desirable that a fixed current that is based on the emitter voltage of the second transistor and the resistance value of the ground-side resistor portion flows through the ground-side resistor portion. It is desirable that the value of the fixed current is a value corresponding to the sum of the value of the second current, the value of the third current, and the value of the current flowing through the Zener diode from the cathode side to the anode side. It is desirable that the current flowing through the Zener diode from the cathode side to the anode side decreases in accordance with an increase in the second current. Further, it is desirable that the Zener diode does not break down when the current flowing from the cathode side to the anode side of the Zener diode is lower than or equal to a predetermined current value (that is, when the voltage applied to the second conductive path is lower than or equal to a predetermined value). It is desirable that when a current flows from the cathode side to the anode side in the Zener diode, the voltage applied to the second conductive path has a value corresponding to the sum of the voltage across the Zener diode and the emitter voltage of the second transistor. In such a configuration, it is desirable that the control unit stops the output of the operating voltage when the voltage of the second conductive path is lower than or equal to the threshold value, and in response to this, the second transistor is operated so as to be in a non-electricity-flowing state and the switch is operated so as to be in an off state. According to such a configuration, most or all of the elements other than the control unit can be configured by passive elements, which is advantageous in terms of keeping the circuit scale from being complex and reducing the cost.

Specific examples of a voltage regulator and an in-vehicle backup power supply according to the present disclosure will be described below with reference to the drawings. Note that the present invention is not limited to these examples, but defined by the scope of the claims, and is intended to include all modifications within the meaning and scope equivalent to the scope of the claims.

Figure 2:
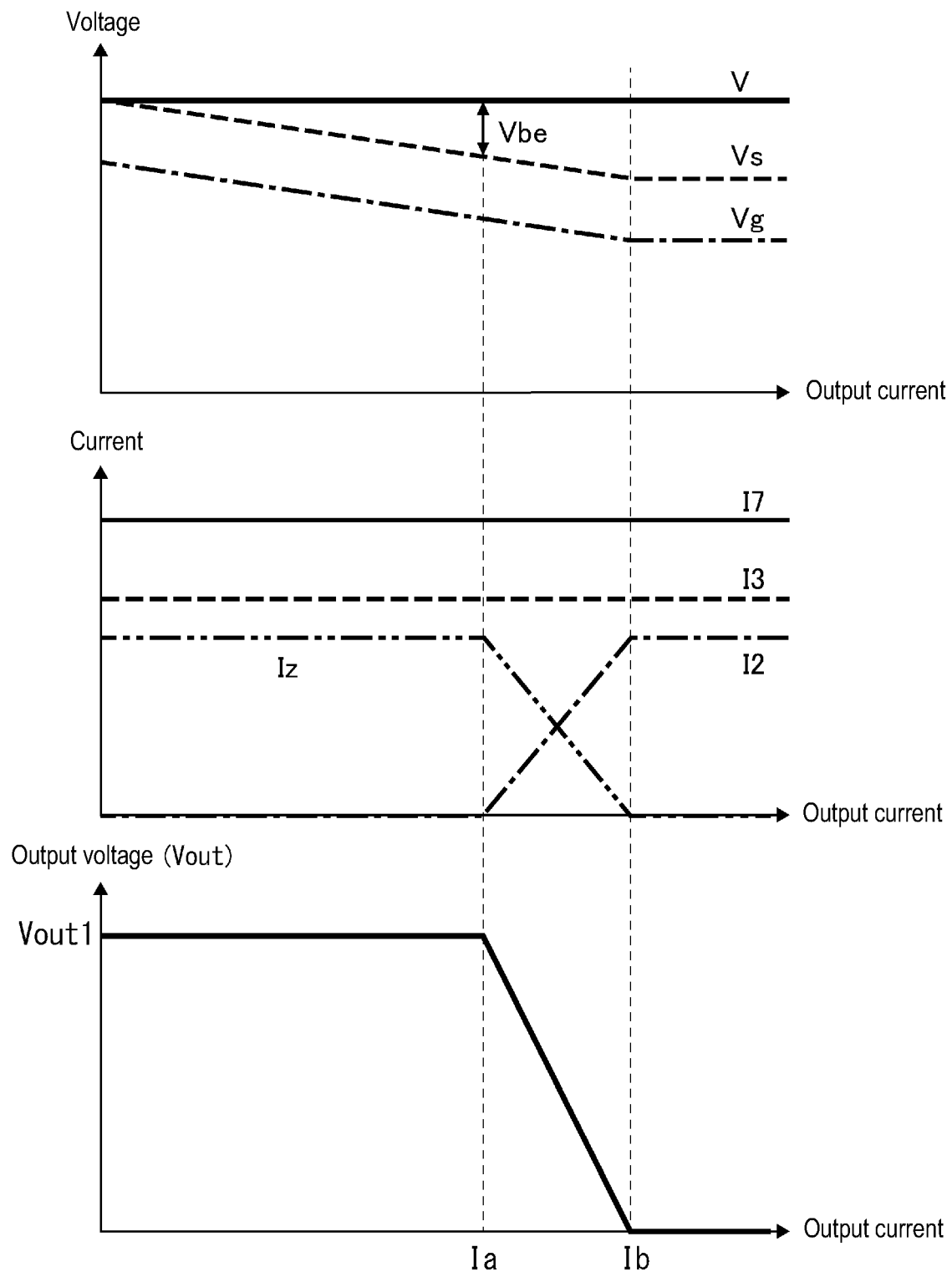
FIG. 2 is an explanatory diagram illustrating, in association with each other, a graph showing a relationship between an output current and voltages, a graph showing a relationship between an output current and currents, and a graph showing a relationship between an output current and an output voltage in the voltage regulator according to the embodiment.

The voltage regulator of the present disclosure will be described with reference to FIGS. 1 and 2. A voltage regulator 10 shown in FIG. 1 has a configuration in which an input voltage is input based on power that is supplied via a first conductive path 91, and an output voltage is output to a second conductive path 92. The voltage regulator 10 includes a switch 21, a resistor (first resistor portion) 31, a resistor (second resistor portion) 32, a resistor (third resistor portion) 33, a resistor 34, a resistor (ground-side resistor portion) 37, a transistor (first transistor) 41, a transistor (second transistor) 42, a Zener diode 51, and a control unit 60.

The switch 21 is configured as a P-channel MOSFET. The switch 21 is provided between the first conductive path 91 and the second conductive path 92. The source of the switch 21 is electrically connected to a third conductive path 93. The source of the switch 21 and the third conductive path 93 have the same potential. The drain of the switch 21 is electrically connected to the second conductive path 92. The drain of the switch 21 and the second conductive path 92 have the same potential. The gate (control terminal) of the switch 21 is electrically connected to the collector of the transistor 41 described later, the other end of the resistor 33, and the collector of the transistor 42. The gate of the switch 21, the collector of the transistor 41, the other end of the resistor 33, and the collector of the transistor 42 have the same potential.

The resistor 31 is provided between the first conductive path 91 and the third conductive path 93. One end of the resistor 31 is electrically connected to the first conductive path 91. The one end of the resistor 31 and the first conductive path 91 have the same potential. The other end of the resistor 31 is electrically connected to the source of the switch 21 via the third conductive path 93. The other end of the resistor 31 and the third conductive path 93 have the same potential.

The resistor 32 is provided between the first conductive path 91 and the transistor 41. One end of the resistor 32 is electrically connected to the first conductive path 91. The other end of the resistor 32 is electrically connected to the emitter of the transistor 41. The other end of the resistor 32 and the emitter of the transistor 41 have the same potential.

The resistor 33 is provided between the first conductive path 91 and the transistor 41. One end of the resistor 33 is electrically connected to the third conductive path 93. The one end of the resistor 33 and the third conductive path 93 have the same potential. The other end of the resistor 33 is electrically connected to the collector of the transistor 41, the collector of the transistor 42, and the gate of the switch 21.

The resistor 34 is provided between the third conductive path 93 and the transistor 41. One end of the resistor 34 is electrically connected to the third conductive path 93. The one end of the resistor 34 and the third conductive path 93 have the same potential. The other end of the resistor 34 is electrically connected to the base of the transistor 41. The other end of the resistor 34 and the base of the transistor 41 have the same potential.

The transistor 41 is configured as a PNP-type bipolar transistor. The base of the transistor 41 is electrically connected to the other end of the resistor 34. The emitter of the transistor 41 is electrically connected to the other end of the resistor 32. The collector of the transistor 41 is electrically connected to the other end of the resistor 33, the collector of the transistor 42, and the gate of the switch 21.

The transistor 42 is configured as an NPN-type bipolar transistor. The base of the transistor 42 is electrically connected to the other end of a resistor 35 described later and one end of a resistor 36. The base of the transistor 42, the other end of the resistor 35, and the one end of the resistor 36 have the same potential. The collector of the transistor 42 is electrically connected to the collector of the transistor 41, the other end of the resistor 33, and the gate of the switch 21. The emitter of the transistor 42 is electrically connected to one end of the resistor 37 described later and the anode of the Zener diode 51. The emitter of the transistor 42, the one end of the resistor 37, and the anode of the Zener diode 51 have the same potential. The transistor 42 is in an electricity-flowing state in the operating state in which the control unit 60 described later applies an operating voltage to the base thereof.

The control unit 60 functions to apply an operating voltage to the base of the transistor 42. The control unit 60 includes a control circuit 61, the resistor 35, and the resistor 36. When the voltage of the second conductive path 92 is lower than or equal to a threshold voltage described later, the control unit 60 stops the output of the operating voltage. The control circuit 61 is configured as, for example, a microcomputer, and includes a memory such as a CPU, a ROM, or a RAM. The control circuit 61 operates, for example, on the basis of electric power supplied from a power supply, and can operate on power that is supplied from a backup power supply even when the supply of power from the power supply is stopped. The control circuit 61 applies an operating voltage to the base of the transistor 42 via the resistor 35. The control circuit 61 has a function of detecting an output voltage of the second conductive path 92.

The resistor 35 is provided between the control circuit 61 and the transistor 42. One end of the resistor 35 is electrically connected to an output terminal of the control circuit 61. The one end of the resistor 35 and the output terminal of the control circuit 61 have the same potential. The other end of the resistor 35 is electrically connected to one end of the resistor 36 and the base of the transistor 42.

The resistor 36 is provided between the resistor 35 and the ground. The one end of the resistor 36 is electrically connected to the other end of the resistor 35 and the base of the transistor 42. The other end of the resistor 36 is electrically connected to the ground, and has the ground potential.

The resistor 37 is provided between the transistor 42 and the ground. One end of the resistor 37 is electrically connected to the emitter of the transistor 42 and the anode of the Zener diode 51. The other end of the resistor 37 is electrically connected to the ground, and has the ground potential. When the transistor 42 is in the operating state, a current corresponding to an addition value obtained by adding the value of the current flowing through the resistor 32, the value of the current flowing through the resistor 33, and the value of the current flowing through the Zener diode 51 described later flows through the resistor 37.

The Zener diode 51 is provided between the second conductive path 92 and the resistor 37. The anode of the Zener diode 51 is electrically connected to a conductive path between the emitter of the transistor 42 and the one end of the resistor 37. The cathode of the Zener diode 51 is electrically connected to the second conductive path 92. The cathode of the Zener diode 51 and the second conductive path 92 have the same potential. The Zener diode 51 sets the voltage of the second conductive path 92 to a voltage corresponding to the voltage across the second conductive path 92 when the transistor 42 is in the operating state.

Next, overcurrent detection control performed by the voltage regulator 10 will be described.

The control unit 60 applies an operating voltage having a voltage value Vcc to the base of the transistor 42. As a result, the transistor 42 is in an electricity-flowing state, and a current flows from the collector to the emitter. The voltage value Vout of the output voltage output from the voltage regulator 10 to the second conductive path 92 is expressed by V7+Vz, which is the sum of the voltage value V7 of the voltage across the resistor 37 and the Zener voltage Vz of the Zener diode 51. Further, when the resistance value of the resistor 35 is R5, the resistance value of the resistor 36 is R6, and the voltage value of the base-emitter voltage of the transistor 42 is Vbe, the voltage value V7 is expressed by V7=Vcc×R6/(R5+R6)−Vbe. Therefore, the voltage value Vout is expressed by Vout=V7+Vz=Vcc×R6/(R5+R6)−Vbe+Vz.

When a ground fault or the like occurs on the second conductive path 92, the output current flowing through the second conductive path 92 increases. Here, when the voltage value of the power supply voltage is V and the voltage value of the voltage applied to the third conductive path 93 is Vs, the voltage value of the voltage across the resistor 31 is expressed by V−Vs. As the output current increases, Vs decreases and V−Vs increases as shown in FIG. 2. At the timing when the output current is Ia shown in FIG. 2, when V−Vs is approximately the voltage value Vbe of the base-emitter voltage of the transistor 41, the collector current having the current value I2 starts flowing through the transistor 41.

When the current value of the current flowing through the resistor 37 is I7, the current value of the current flowing through the resistor 33 is I3, and the current value of the current flowing through the Zener diode 51 is Iz, the current value I7 is expressed by I7=I2+I3+Iz. I7 is set to a certain value based on Vcc, R5, and R6 according to the characteristics of the transistor 42. I3 is constant because the magnitude of the gate-source voltage of the switch 21 does not substantially change. For this reason, according to the relationship I7=I2+I3+Iz, when I2 increases, Iz decreases. When Iz decreases, Vz decreases. The control unit 60 detects that the voltage value Vout of the output voltage of the second conductive path 92 is lower than or equal to a threshold value (for example, a value smaller than a value Vout1 of the output voltage by which the transistor 41 is in the electricity-flowing state as shown in FIG. 2), and stops the output of the operating voltage. In this manner, the voltage regulator 10 can detect an overcurrent flowing through the second conductive path 92 and stop the operation.

Figure 3:
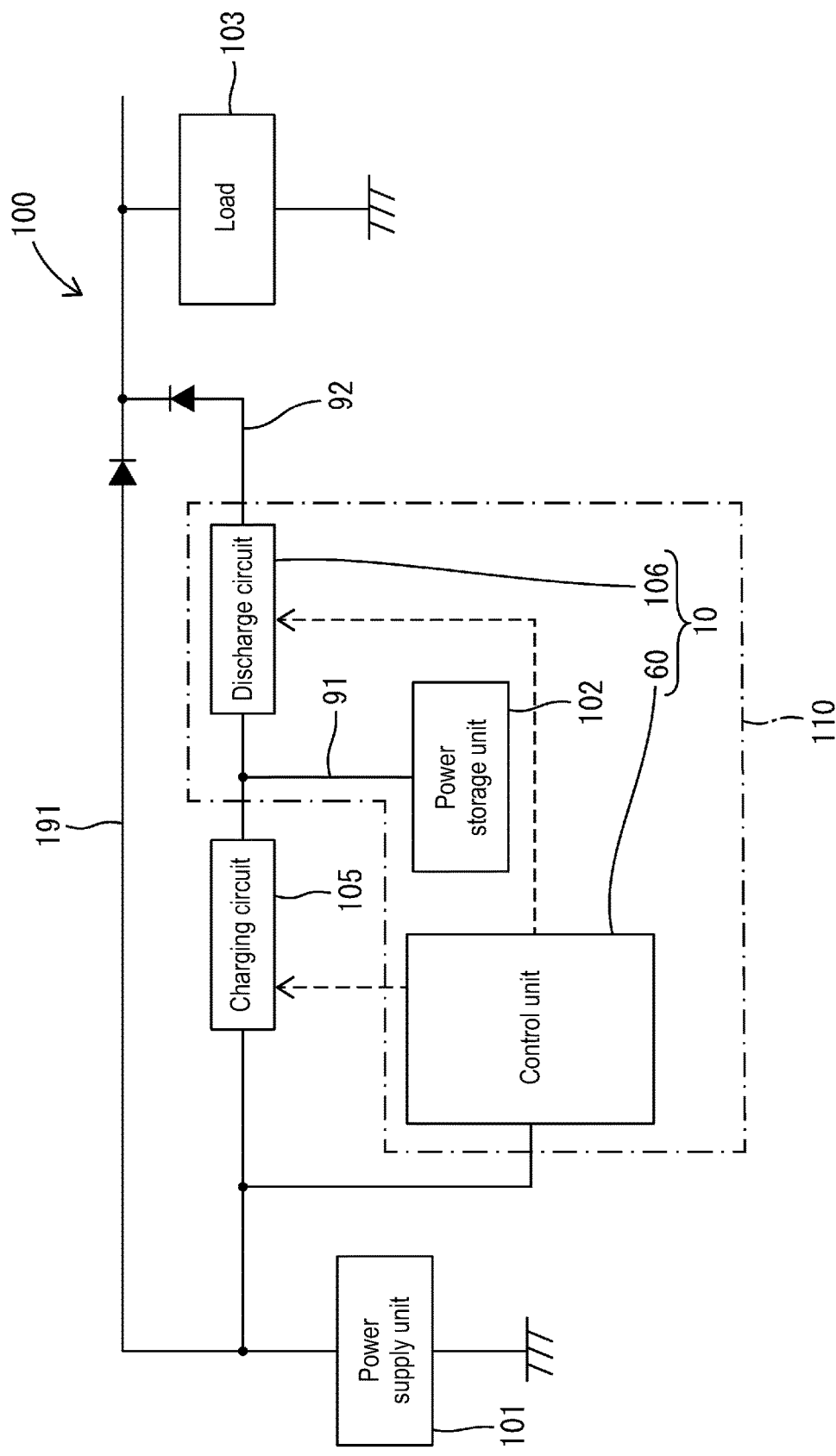
FIG. 3 is a block diagram illustrating an electrical configuration of an in-vehicle power supply system in which the voltage regulator according to the embodiment is applied to a discharge circuit.

Next, an in-vehicle power supply system 100 (hereinafter also referred to as a power supply system 100) to which an in-vehicle backup power supply (hereinafter also referred to as a backup power supply) of the present disclosure is applied will be described with reference to FIG. 3. A power supply system 100 shown in FIG. 3 includes an in-vehicle power supply unit 101 (hereinafter also referred to as a power supply unit 101), a backup power supply 110, a load 103, and a charging circuit 105, and is configured as a system capable of supplying power to the load 103. The backup power supply 110 includes an in-vehicle power storage unit 102 (hereinafter also referred to as a power storage unit 102), a control unit 60, and a discharge circuit 106.

The power supply unit 101 functions as a main power supply. The power storage unit 102 functions as a backup power supply, and serves as a power supply source when power supply from the power supply unit 101 is stopped. The power storage unit 102 is electrically connected to the first conductive path 91. The charging circuit 105 is a circuit that performs a charging operation of charging the power storage unit 102 based on power that is supplied from the power supply unit 101. The discharge circuit 106 is a circuit that performs a discharge operation of discharging power stored in the power storage unit 102. The discharge circuit 106 is electrically connected to the first conductive path 91 and the second conductive path 92. The discharge circuit 106 and the control unit 60 constitute the voltage regulator 10.

The discharge circuit 106 receives, from the control unit 60, a discharge instruction signal instructing that the power storage unit 102 be discharged or a discharge stop signal instructing that discharge of the power storage unit 102 be stopped, and performs a discharge operation of passing a discharge current from the power storage unit 102 to the load 103 and a cutoff operation of cutting off the discharge current. The control unit 60 transmits a discharge instruction signal in response to the establishment of a backup condition. In other words, the control unit 60 applies an operating voltage to the base of the transistor 42. Here, a backup condition is established, for example, when the voltage of the conductive path 191 falls to a predetermined threshold value or lower.

When the discharge circuit 106 receives a discharge instruction signal from the control unit 60, the discharge circuit 106 performs a step-down operation using the voltage of the first conductive path 91 to which the output voltage of the power storage unit 102 is applied as an input voltage, and performs a discharge operation so as to apply a changed output voltage to the second conductive path 92 on the output side. When the discharge circuit 106 receives a discharge stop signal from the control unit 60, the discharge circuit 106 stops such a discharge operation, and performs a cutoff operation so as to bring a portion between the second conductive path 92 and the power storage unit 102 into a non-conductive state. When the discharge circuit 106 is performing the discharge operation, the output current (discharge current) output from the discharge circuit 106 is supplied to the load 103.

When a ground fault or the like occurs on a conductive path (the second conductive path 92 or the like) between the discharge circuit 106 and the load 103, the voltage regulator 10 can detect an overcurrent and stop the discharge operation of the discharge circuit 106.

As described above, in the voltage regulator 10 of the present disclosure, the collector of the transistor 41 is electrically connected to the collector of the transistor 42 and the gate of the switch 21. The transistor 42 is in the electricity-flowing state, during the operating state in which the control unit 60 applies an operating voltage to the base of the transistor 42. The Zener diode 51 sets the voltage of the second conductive path 92 to a voltage corresponding to the voltage across the Zener diode 51 in the above-described operating state. A current corresponding to an addition value obtained by adding the value of the current flowing through the resistor 32 in the operating state, the value of the current flowing through the resistor 33 in the operating state, and the value of the current flowing through the Zener diode 51 in the operating state flows through the resistor 37. When the voltage of the second conductive path 92 is lower than or equal to a threshold value, the control unit 60 stops the output of the operating voltage.

With this configuration, it is possible to realize a configuration in which the output can be forcibly stopped when the output current flowing through the second conductive path 92 exceeds the reference, while keeping the circuit scale from being complex. In particular, main elements other than the control unit 60 can be mainly constituted by passive elements, which is highly advantageous in simplifying and miniaturizing a circuit.

In the voltage regulator 10 of the present disclosure, the following actions and operations occur.

First, when the transistor 42 is in a non-electricity-flowing state, no current flows through the resistor 33, and when the transistor 42 is in an electricity-flowing state, a third current corresponding to a potential difference between one end of the switch 21 on the resistor 31 side and the gate of the switch 21 flows through the resistor 33. When the third current flows, the switch 21 is turned on. Because the resistor 31 is interposed between the first conductive path 91 and the switch 21, the voltage at the other end of the resistor 31 is set to a value corresponding to the current flowing through the switch 21. The emitter of the transistor 41 is connected to the first conductive path 91 via the resistor 32, and the base of the transistor 41 is electrically connected to the third conductive path 93 between the resistor 31 and the switch 21 directly or via another member. With this configuration, a current flows through the transistor 41 when the first current flowing through the resistor 31 exceeds a predetermined value, and the second current flows through the resistor 32. When the first current flowing through the resistor 31 is lower than or equal to a predetermined value, no current flows through the transistor 41, and the second current does not flow through the resistor 32. When the transistor 42 is in an electricity-flowing state, the emitter voltage of the transistor 42 is a fixed value that is based on the base voltage and the base-emitter voltage of the transistor 42. A fixed current based on the emitter voltage of the transistor 42 and the resistance value of the resistor 37 flows through the resistor 37. The value of the fixed current is a value corresponding to the sum of the value of the above second current, the value of the above third current, and the value of the current flowing through the Zener diode 51 from the cathode side to the anode side. The current flowing through the Zener diode 51 from the cathode side to the anode side decreases in accordance with an increase in the second current. Further, the Zener diode 51 does not break down when the current flowing from the cathode side to the anode side of the Zener diode 51 is lower than or equal to a predetermined current value (that is, when the voltage applied to the second conductive path 92 is lower than or equal to a predetermined value). When a current flows from the cathode side to the anode side in the Zener diode 51, the voltage applied to the second conductive path 92 has a value corresponding to the sum of the voltage across the Zener diode 51 and the emitter voltage of the transistor 42. In such a configuration, when the voltage of the second conductive path 92 is lower than or equal to a threshold value, the control unit 60 stops the output of the operating voltage. In response to this, the transistor 42 is in the non-electricity-flowing state and the switch 21 turns to an off state. According to such a configuration, most or all of the elements other than the control unit 60 can be configured by passive elements, which is advantageous in terms of suppressing the circuit scale and reducing the cost.

Other Embodiments of the Present Disclosure

It should be understood that the embodiments disclosed herein are illustrative and non-restrictive in every respect. The following embodiments can be adopted, for example.

In the embodiment, the voltage value Vout of the output voltage can be adjusted to a desired value by changing the resistance values of the resistors 35 and 36 to any values and changing the value of the voltage applied from the control unit 60 to the base of the transistor 42.

In the embodiment, the base of the transistor 41 is electrically connected to the other end of the resistor 34. However, the base of the transistor 41 may also be directly electrically connected to the third conductive path 93 without being interposed by the resistor 34.

The invention claimed is:

1. A voltage regulator configured to receive an input voltage based on power supplied via a first conductive path, and output an output voltage to a second conductive path, the voltage regulator comprising:
   a switch including a control terminal, and provided between the first conductive path and the second conductive path;
   a first resistor portion having one end electrically connected to the first conductive path and another end electrically connected to the switch;
   a PNP-type first transistor having a base electrically connected to a conductive path between the first resistor portion and the switch directly or via a resistor;
   a second resistor portion having one end electrically connected to the first conductive path and another end electrically connected to an emitter of the first transistor;
   a third resistor portion having one end electrically connected to the conductive path between the first resistor portion and the switch, and another end electrically connected to a collector of the first transistor;
   an NPN-type second transistor;
   a ground-side resistor portion having one end electrically connected to an emitter of the second transistor and another end electrically connected to the ground;
   a Zener diode having an anode electrically connected to a conductive path between the emitter of the second transistor and the ground-side resistor portion, and a cathode electrically connected to the second conductive path; and
   a control unit configured to apply an operating voltage to a base of the second transistor,
   wherein the collector of the first transistor is electrically connected to a collector of the second transistor and the control terminal,
   electricity flows through the second transistor in the operating state in which the control unit applies the operating voltage to the base of the second transistor;
   the Zener diode sets, in the operating state, a voltage of the second conductive path to a voltage corresponding to a voltage across the Zener diode;
   a current corresponding to an addition value obtained by adding a value of a current flowing through the second resistor portion in the operating state, a value of a current flowing through the third resistor portion in the operating state, and a value of a current flowing through the Zener diode in the operating state flows through the ground-side resistor portion, and
   the control unit stops the output of the operating voltage when the voltage of the second conductive path is lower than or equal to a threshold value.

2. An in-vehicle backup power supply, comprising:
   a power storage unit electrically connected to the first conductive path; and
   the voltage regulator according to claim 1,
   wherein the control unit applies the operating voltage to the base of the second transistor in response to establishment of a backup condition.

* * * * *